United States Patent
Loibl et al.

(10) Patent No.: US 8,339,789 B2
(45) Date of Patent: Dec. 25, 2012

(54) USE OF AN ELECTRONIC MODULE FOR AN INTEGRATED MECHATRONIC TRANSMISSION CONTROL OF SIMPLIFIED DESIGN

(75) Inventors: Josef Loibl, Bad Abbach (DE); Thomas Preuschl, Eilsbrunn (DE); Hermann-Josef Robin, Regensburg (DE); Karl Smirra, Wasserburg (DE)

(73) Assignee: Continental Automotive GmbH, Hannover (DE)

( * ) Notice: Subject to any disclaimer, the term of this patent is extended or adjusted under 35 U.S.C. 154(b) by 374 days.

(21) Appl. No.: 12/668,710

(22) PCT Filed: Jun. 26, 2008

(86) PCT No.: PCT/EP2008/058126
§ 371 (c)(1),
(2), (4) Date: Mar. 17, 2010

(87) PCT Pub. No.: WO2009/007241
PCT Pub. Date: Jan. 15, 2009

(65) Prior Publication Data
US 2010/0226098 A1   Sep. 9, 2010

(30) Foreign Application Priority Data
Jul. 12, 2007  (DE) .................. 10 2007 032 535

(51) Int. Cl.
*H05K 7/20* (2006.01)
(52) U.S. Cl. ....................................... 361/719; 361/715

(58) Field of Classification Search .................. None
See application file for complete search history.

(56) References Cited

U.S. PATENT DOCUMENTS

| | | | |
|---|---|---|---|
| 5,061,193 A | 10/1991 | Seaman | |
| 5,208,413 A | 5/1993 | Tsumura et al. | |
| 5,280,413 A * | 1/1994 | Pai | 361/792 |
| 5,586,388 A * | 12/1996 | Hirao et al. | 29/830 |
| 6,530,856 B1 | 3/2003 | Kakiage | |
| 6,674,344 B2 * | 1/2004 | Berberich | 333/185 |
| 6,805,146 B2 | 10/2004 | Albert et al. | |
| 7,656,674 B2 | 2/2010 | Wetzel et al. | |
| 7,749,134 B2 | 7/2010 | Wetzel et al. | |
| 7,859,852 B2 * | 12/2010 | Wetzel et al. | 361/749 |
| 2001/0017538 A1 | 8/2001 | Loibl et al. | |
| 2002/0054480 A1* | 5/2002 | Jitaru | 361/704 |
| 2004/0045736 A1* | 3/2004 | Jungbauer et al. | 174/250 |
| 2008/0017174 A1 | 1/2008 | Kafer et al. | |
| 2008/0156511 A1 | 7/2008 | Hauer et al. | |
| 2008/0285230 A1* | 11/2008 | Bojan et al. | 361/689 |
| 2009/0002959 A1* | 1/2009 | Loibl et al. | 361/749 |

FOREIGN PATENT DOCUMENTS

| | | |
|---|---|---|
| DE | 9116280 U1 | 6/1992 |
| DE | 4208610 C1 | 5/1993 |
| DE | 19518522 A1 | 11/1996 |

(Continued)

*Primary Examiner* — Gregory Thompson
(74) *Attorney, Agent, or Firm* — Laurence A. Greenberg; Werner H. Stemer; Ralph E. Locher

(57) ABSTRACT

An electronic module for an integrated mecatronic transmission control includes a housing cover and at least one multi-layer circuit board as an electrical connection between an interior of the housing and components located outside the housing. The multi-layer circuit board is a circuit carrier for electronic components of central control electronics and at the same time is a thermal connection to a base plate.

10 Claims, 1 Drawing Sheet

FOREIGN PATENT DOCUMENTS

| | | |
|---|---|---|
| DE | 29623190 U1 | 12/1997 |
| DE | 19751095 C1 | 5/1999 |
| DE | 19837640 A1 | 4/2000 |
| DE | 19856839 A1 | 6/2000 |
| DE | 10051945 C1 | 11/2001 |
| DE | 10130833 A1 | 1/2002 |
| DE | 10113912 A1 | 10/2002 |
| DE | 102004061818 A1 | 7/2006 |
| DE | 102005002813 A1 | 8/2006 |
| DE | 102005015717 A1 | 10/2006 |
| DE | 102005022536 A1 | 11/2006 |
| DE | 10248112 B4 | 1/2007 |
| DE | 102007019098 A1 | 11/2008 |
| EP | 0375271 A2 | 6/1990 |
| EP | 0534290 A2 | 3/1993 |
| EP | 0727931 A2 | 8/1996 |
| EP | 1248020 A2 | 10/2002 |
| JP | 2004022687 A | 1/2004 |
| JP | 2005045069 A | 2/2005 |
| WO | 2005058664 A2 | 6/2005 |
| WO | 2006066983 A1 | 6/2006 |

\* cited by examiner

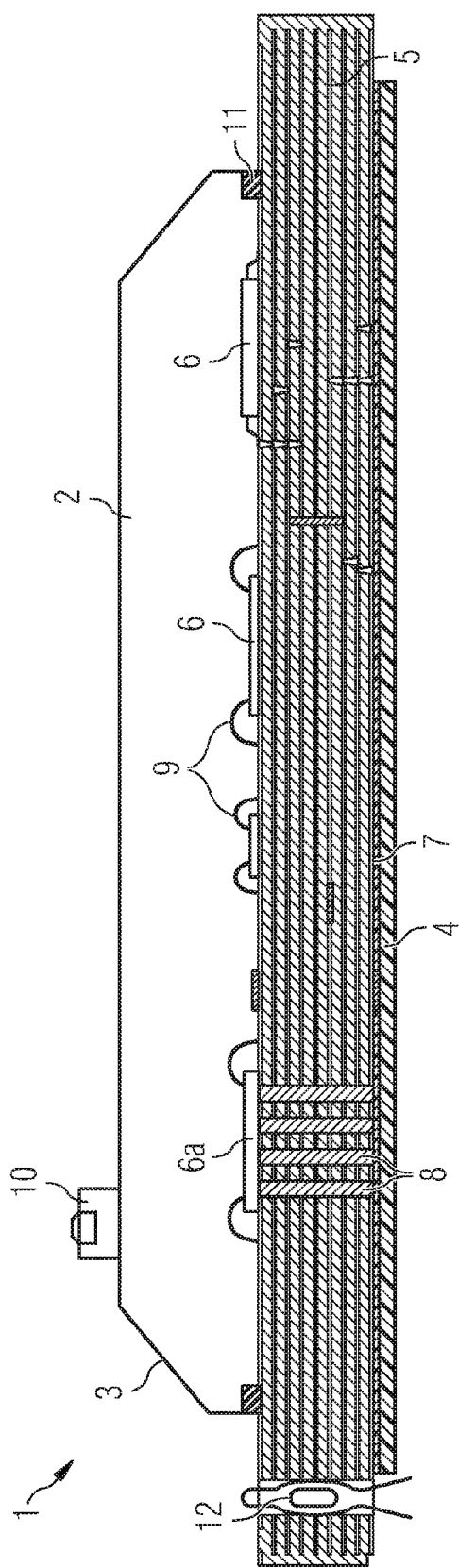

USE OF AN ELECTRONIC MODULE FOR AN INTEGRATED MECHATRONIC TRANSMISSION CONTROL OF SIMPLIFIED DESIGN

BACKGROUND OF THE INVENTION

Field of the Invention

The invention relates to the use of an electronic module for an integrated mechatronic transmission control including a housing cover and at least one multi-layer printed circuit board as an electrical connection between an inner chamber of the housing and components located outside the housing, in particular for transmission and engine controls in the automotive industry.

In automotive engineering, there is an increasing trend for components such as transmission-, engine-, or braking systems to be controlled predominantly by electronic means, with a development towards integrated mechatronic controls, that is, towards the integration of control electronics and the corresponding electronic components, such as sensors or valves, into the transmission, engine, or braking system. Control devices thus generally comprise a plurality of electronic components that are connected to other components outside the control device. In such "stand-alone electronics", these controls are no longer housed in a separate protected electronics chamber, and therefore have to withstand environmental influences and mechanical, thermal and also chemical stresses.

For this reason, such control systems are normally integrated into special housings. Moreover, the housings fulfill an important protective function. In order to enable a reliable connection to be established with components located outside the housing, an electrical connection is required between the inside and the outside of the housing.

The usual design for such integrated mechatronic applications consists of a ceramic substrate that contains the various electronic components that form the central control unit. This ceramic substrate is connected by bonding to rigid or flexible printed circuit boards in order to allow the peripheral components to be connected to the central unit. As has already been described, transmission control modules, for example, are housed in the oil sump, and are therefore completely surrounded by oil and the conductive contamination that is contained therein. This can consist of, for example, contamination resulting from gear tooth wear, machine chips from production processes or from inadequate washing- and cleaning processes for the transmission housing and/or of the fitted components. To provide the required protection against such contamination, damage and short circuits in the conductive path or bond, a cover, usually in the form of a metallic, non-metallic or metalized housing cover, is fitted onto the housing base plate and hermetically sealed. This complete laminate consisting of ceramic substrate, printed circuit boards and the connection thereof to the electronic connection in the periphery, together with the hermetically sealed housing, is a significant cost driver. It is precisely the LTCCs (Low Temperature co-fired Ceramics) which are preferably used for printed circuit boards and which are fitted onto a base plate to provide mechanical stability and a thermal connection that represent a major cost factor for the component as a whole. The electronic connection thereof via flexible printed circuit boards or punched grids to the components located outside the sealed housing is, moreover, complex and therefore costly.

BRIEF SUMMARY OF THE INVENTION

The object of the invention can therefore be considered to be that of providing a use for an electronic module comprising a housing, a central control unit encompassing various electronic components and located therein, and an electronic connection between the area inside the housing and the area outside the housing, which provides a simple and flexible connection to components located outside the housing, the electronic connection and the central control unit having a simplified and thus cheaper design and at the same time being safely protected against short-circuits and/or conductive contamination.

This is solved according to the invention by the use of a device according to the invention.

The invention suggests the use, for an integrated mechatronic transmission control, of an electronic module comprising at least one housing cover and a multi-layer printed circuit board as an electrical connection between the inside of the housing and components located outside the housing, wherein the multi-layer printed circuit board is a circuit substrate for the electronic components of the central control electronics and at the same time provides a thermal connection to the base plate.

In other words, according to the invention, a printed circuit board assembly is used as a signal- and potential distribution component for an integrated mechatronic transmission control. Furthermore, said assembly comprises the electronic components of the central control unit and, moreover, ensures the dissipation of the heat generated by the power units. This means that the use of expensive circuit substrates such as, for example, LTCCs (Low Temperature co-fired Ceramics) or HTCs (High Temperature Ceramics) and the connection thereof to the peripheral components by means of rigid or flexible printed circuit boards is no longer necessary. The use, according to the invention, of the electronic modules, means that, advantageously, the support function, the distribution of signals and potential and the thermal connection to the heat-dissipating base plate or mounting can be handled by one single component, that is, the printed circuit board. According to the invention, the base plate can also be the hydraulic plate of a vehicle transmission. In this way, significant costs of ceramic LTCCs and the complex connection thereof to the heat-dissipation unit and the peripheral components such as sensors, valves or other elements can be avoided, in contrast to the this existing design and use. According to the invention, PCB-circuit boards (Printed Circuit Boards) can be used, for example.

In a preferred development of the invention, the electronic module used according to the invention can be laminated onto a base plate in order to achieve an improved and more precise heat dissipation.

In this use, the base plate preferably consists of a metallic material, aluminum being particularly preferred is. In a preferred embodiment of the invention, the multi-layer printed circuit board is laminated onto the metallic base plate. This ensures reliable and cost-effective mounting. Moreover, this allows the electronics chamber to be sealed in a downward direction, from the gear oil, for example. The housing cover may consist of any material that allows a secure cover for the surface of the electronics chamber containing the components of the central control unit and at the same time provides the required EMC shielding values. For example, a metalized plastic molded body can be used. In an advantageous embodiment, however, the housing cover is likewise manufactured from a metallic material, such as steel sheet, for example. This results in improved long-term stability and improved shielding values over the entire life of the electronic control device. In addition, an improved diffusion seal is achieved.

In a preferred embodiment of the invention, the multi-layer printed circuit board can comprise various vias for thermal connection to the base plate and for electronic connection to the components located outside the housing.

The term Via (Vertical Interconnection Access) is understood according to the invention to mean a through-plated hole that is arranged between the conductive path surfaces of a multi-layer printed circuit board.

The connection is generally created with a hole, metalized on the inside, in the substrate material of the printed circuit board or plate. It is also usual to have rivets and pins. Such through-plated holes are produced by seeding the hole in the substrate material, that is, treating it with a catalyst, subsequently metalizing it and then, optionally, electrolytically reinforcing it. The through-plated hole can serve at the same time as a soldering point for leaded electronic components or be provided only for the purpose of electrical bonding.

Specific vias can also or exclusively serve the function of improving vertical conduction of heat, and they are then also known as thermal vias. Alternatively or additionally metallic inlays, preferably copper inlays, can be used for the dissipation of heat.

In order to reduce the inductivity of the wiring or increase the current-carrying capacity, a plurality of through-plated holes can be inserted in parallel for a connection.

With the aid of through-plated holes, it is possible to change the conductive path surfaces in two- or multi-layer printed circuit boards. This is a great advantage, particularly with a view to effective disentangling of complex circuits. If the through-plated hole is very small in diameter, the through-plated hole is also known as a micro-via. Said micro-vias can be drilled using a laser, for example.

A different type of generic contact extends not through the whole plate, but only to one of the central layers. In this case the contact is known as a blind via. If the specially designed vias are to a certain extent buried only between central layers, the expression buried via is then often used. Increasingly, wired electronic components are being replaced by wireless Surface Mounted Devices, and modern printed circuit boards therefore have a fairly large number of through-plated holes that do not accommodate any electronic components.

Advantageously, through-plated multi-layer printed circuit boards provide a better hold and a more reliable connection of wire-leaded electronic components. They can therefore be used in simple high quality assemblies. In addition, a very variable design of the thickness of the conducting path layers can be achieved in the use according to the invention, which is not possible in the flexible printed circuit boards that are conventionally used.

In a further embodiment, the multi-layer printed circuit board can be configured in one piece or have a plurality of parts.

Alternatively or additionally, the multi-layer printed circuit board comprises areas rendered flexible by means of depth milling. As a result, the printed circuit board in the use according to the invention can be adapted as a three-dimensional structure to the specific requirements of the substrate element of an integrated mechatronic transmission control without an additional connection to flexible connection components being necessary. In this way, complex structures can also be achieved. Similarly, by using specific milling techniques, flexible areas can be arranged in the contact point area, in order to provide a simplified connection with peripheral components.

As already indicated in the aforementioned, in the use of an electronic module according to the invention, a substrate element of plastic and/or metal can also be partially affixed, by gluing for example, to an area of the electronic module in order to increase the rigidity or improve the heat dissipation.

In a preferred embodiment of the use according to the invention, the electronic connection of the components located outside the housing may be achieved by means of press-fit technology, soldering and/or laser welding.

By using "press fit-pins" in press fit technology, a variable, simple and safe electronic connection to the peripheral components can be achieved. Likewise preferably, this connection can also be created by soldering or laser welding according to what is required of the component. Generally speaking, the method of creating the connection is not critical and it may be selected from methods known to a person skilled in the art depending on the requirements for the components and the process installations that are present. Thus the connections can be created such that they are detachable, in the form of plug-in connectors, for example, or non-detachable, by soldering or welding them, for example. It is particularly preferable for the printed circuit board to be connected directly to the signal transmitters and receivers (in particular sensors, valves, etc.) outside the housing. In a different preferred embodiment, the electronic components of the central control unit can be integrated into the multi-layer printed circuit board. As far as the electronic components are concerned, printed resistors or capacitors, which may also be configured as cables or surfaces and likewise chips or complex chips (ICs) can be used. In this way, an increased long-term stability and an excellent connection to the signal- and potential distribution system can be guaranteed.

The electronic components of the central control electronics can preferably be affixed and/or bonded by means of soldering methods, gluing or bonding onto the multi-layer printed circuit board. The soldering method can be a reflow soldering method, for example.

Alternatively or additionally, the electronic components of the central control electronics are molded with the multi-layer printed circuit board.

The above industrial processes can easily be automated and thus incorporated into existing processes for the production of integrated mechatronic transmission controls.

For the manufacture of an electronic module for an integrated mechatronic gearbox controller according to the invention, at least one multi-layer printed circuit board is equipped with the electronic components of the central control electronics.

The printed circuit board is fitted onto the base plate, connected to the components located outside the housing and the housing cover is then attached. The sequence can be such that the placing of components on the printed circuit board is effected either before or after it is fitted onto the base plate.

In a preferred embodiment of the invention, a rigid multi-layer printed circuit board is laminated onto an aluminum housing base. It is particularly preferable for the printed circuit board to be affixed to a base plate using acrylic adhesive. In this way, it is also possible to provide modules comprising a plurality of components that can be subjected to thermal stress and have a high long-term stability.

The invention is described hereafter by way of example using a design variant and in conjunction with the drawing, but without being restricted thereto.

BRIEF DESCRIPTION OF THE SEVERAL VIEWS OF THE DRAWING

In the drawing, the FIGURE shows a cross-section view of an electronic module used according to the invention for an integrated mechatronic transmission control.

DESCRIPTION OF THE INVENTION

The FIGURE shows a cross-section view of an electronic module 1 for an integrated mechatronic transmission control having a housing 2. The housing 2 is formed from a housing cover 3, a base plate 4, on which a multi-layer printed circuit board 5 is fitted as an electrical connection between the components located inside and outside the housing 2. According to the invention, the multi-layer printed circuit board 5 additionally comprises the circuits for various electronic components 6 of the central control electronics and at the same time provides a thermal connection to the base plate 4.

Advantageously, the use according to the invention means that one single multi-layer printed circuit board 5 fulfils a plurality of functions that hitherto had to be performed by various components. The printed circuit board 5 is preferably laminated onto the base plate 4. The laminated layer 7 can be a heat-conducting adhesive layer that advantageously assists the dissipation of heat from the central control electronics. The dissipation of heat from the electronic components 6, for example, an electronic chip 6a, can be achieved using thermal vias 8 or copper inlays that can be drilled through the various layers of the printed circuit board 5. The thermal vias 8 can be filled with heat-conducting paste. The electrical connection of the electronic components 6 onto the printed circuit board 5 can be achieved using heavy wire bonds, for example. These can be gold bonding wires, for example. The mechanical attachment of the components in the electronic chamber, that is, inside the housing, can be achieved by standard soldering methods, for example, by reflow soldering methods, or by gluing.

Alternatively or additionally, a sealing compound can be inserted through a sealable aperture 10 in the housing cover 3, thus further improving the mechanical attachment and the protection of the electronic components 6 and the bonding wires 9. The hermetic sealing of the electronic compartment comprising the electronic components 6 can be achieved using known methods such as insert seals 11, sealing compounds and/or by laminating the housing cover 3 onto the base plate 4 and/or the printed circuit board 5. The electronic attachment of peripheral components can be achieved, for example, using a press fit connection with press fit pins 12 or by laser welding.

To summarize, the use of an electronic module for an integrated mechatronic transmission control is suggested, wherein the function of the circuit substrate both for the electronic components and the electronic connection to the peripheral components is provided by the printed circuit board. The transmission of signals and potential can likewise be assured in a reliable manner with long-term stability by the printed circuit board and likewise the thermal connection to the base plate or comparable heat dissipation systems. The module that is thus provided is simple and flexible to manufacture and can be produced using standard processes. In particular, the development of new high-temperature materials for printed circuit boards (PCBs) and electronic components and likewise the use according to the invention of specific vias for heat dissipation allows an arrangement of the components that is considerably reduced in size compared with existing PCB modules. Assembly can therefore be integrated into the whole assembly process for an electronic device in a simple and cost-efficient manner.

The invention claimed is:

1. An electronic module for an integrated mechatronic transmission control, the electronic module comprising:
   electronic components of central control electronics;
   a housing including a housing cover and a base plate, said housing defining an inner chamber;
   at least one peripheral component located outside said housing; and
   at least one multi-layer printed circuit board providing an electrical connection between said inner chamber of said housing and said peripheral component located outside said housing, said at least one multi-layer printed circuit board providing a circuit substrate for said electronic components and a thermal connection to said base plate;
   said peripheral component mounted on said multi-layer printed circuit board at a position laterally outside of said housing.

2. The electronic module according to claim 1, wherein said at least one multi-layer printed circuit board is laminated onto said base plate.

3. The electronic module according to claim 1, wherein said at least one multi-layer printed circuit board has various vias for thermal connection to said base plate and for electronic connection to said peripheral component located outside said housing.

4. The electronic module according to claim 1, wherein said at least one multi-layer printed circuit board is configured in one piece or in a plurality of parts.

5. The electronic module according to claim 1, wherein said at least one multi-layer printed circuit board has areas rendered flexible by depth milling.

6. The electronic module according to claim 1, wherein the electrical connection of said peripheral component located outside said housing is achieved by at least one connection selected from the group consisting of press-fitting, soldering and laser welding.

7. The electronic module according to claim 1, wherein said electronic components of said central control electronics are integrated into said at least one multi-layer printed circuit board.

8. The electronic module according to claim 1, wherein said electronic components of said central control electronics are affixed and/or bonded onto said at least one multi-layer printed circuit board by soldering processes or gluing.

9. The electronic module according to claim 7, wherein said electronic components of said central control electronics are molded with said at least one multi-layer printed circuit board.

10. The electronic module according to claim 1, wherein said peripheral component, which is mounted on said multi-layer printed circuit board, is selected from the group consisting of a sensor and a valve.

\* \* \* \* \*